(12) United States Patent
Lee et al.

(10) Patent No.: US 10,379,947 B2
(45) Date of Patent: Aug. 13, 2019

(54) SEMICONDUCTOR DEVICE

(71) Applicant: SK hynix Inc., Icheon (KR)

(72) Inventors: Jae In Lee, Icheon (KR); Yong Mi Kim, Hwaseong (KR)

(73) Assignee: SK HYNIX INC., Icheon (KR)

( * ) Notice: Subject to any disclaimer, the term of this patent is extended or adjusted under 35 U.S.C. 154(b) by 134 days.

(21) Appl. No.: 15/639,643

(22) Filed: Jun. 30, 2017

(65) Prior Publication Data

US 2018/0196713 A1    Jul. 12, 2018

(30) Foreign Application Priority Data

Jan. 11, 2017    (KR) ........................ 10-2017-0004431

(51) Int. Cl.
| | |
|---|---|
| *G11C 29/00* | (2006.01) |
| *G06F 11/10* | (2006.01) |
| *G11C 29/52* | (2006.01) |
| *G11C 29/14* | (2006.01) |
| *G11C 29/42* | (2006.01) |
| *G11C 29/46* | (2006.01) |
| *G11C 11/4096* | (2006.01) |
| *G11C 11/4076* | (2006.01) |

(52) U.S. Cl.
CPC ...... *G06F 11/1068* (2013.01); *G06F 11/1048* (2013.01); *G11C 29/14* (2013.01); *G11C 29/42* (2013.01); *G11C 29/46* (2013.01); *G11C 29/52* (2013.01); *G11C 11/4076* (2013.01); *G11C 11/4096* (2013.01); *G11C 2207/229* (2013.01)

(58) Field of Classification Search
CPC .. G06F 11/1068; G06F 11/1048; G11C 29/52; G11C 29/42; G11C 29/46; G11C 29/14; G11C 11/4096; G11C 11/4076; G11C 2207/229; G11C 7/1006; G11C 7/22; G11C 2029/0411
See application file for complete search history.

(56) References Cited

U.S. PATENT DOCUMENTS

| 2010/0315142 A1 | 12/2010 | Zerbe | |
|---|---|---|---|
| 2011/0099459 A1* | 4/2011 | Nakamura | .......... G06F 11/1048 714/763 |

FOREIGN PATENT DOCUMENTS

KR    10-2012-0049436 A    5/2012

* cited by examiner

*Primary Examiner* — Guerrier Merant

(57) ABSTRACT

A semiconductor device includes a write read control circuit for outputting a write enable signal which is enabled in response to a write command, and a test mode signal; and an error correction circuit suitable for performing a calculation operation of determining an error information of input data in response to the write enable signal and then outputting an internal parity signal including the error information, and outputting internal data by delaying the input data in response to the write enable signal.

20 Claims, 12 Drawing Sheets

SEMICONDUCTOR DEVICE

CROSS-REFERENCE TO RELATED APPLICATION

The present application claims priority under 35 U.S.C. § 119(a) to Korean Patent Application No. 10-2017-0004431 filed on Jan. 11, 2017 in the Korean Intellectual Property Office, which is incorporated herein by reference in its entirety.

BACKGROUND

1. Technical Field

Embodiments of the present disclosure relate to a semiconductor device which performs an error correction operation for data.

2. Related Art

Recently, in order to increase the operating speed of a semiconductor device, DDR2 or DDR3 signaling is used, in which 4-bit or 8-bit data are inputted/outputted in each clock cycle. In the case where an input/output speed of data is increased, the probability of an error to occur during a data transmission process increases. Therefore, a separate device and method for ensuring the reliability of data transmission are additionally demanded.

There is disclosed a method of generating, at each time of transmitting data, error codes capable of checking occurrence of an error and transmitting the error codes with data, thereby ensuring the reliability of data transmission. The error codes include an error detection code (EDC) capable of detecting an error occurred and an error correction code (ECC) capable of correcting, by itself, an error when it has occurred.

SUMMARY

Various embodiments are directed to a semiconductor device which performs a write operation and a read operation by delaying data by a time for which an error correction operation is performed.

In an embodiment, a semiconductor device may include: a write read control circuit suitable for outputting a write enable signal which is enabled in response to a write command, and a test mode signal; and an error correction circuit suitable for performing a calculation operation of determining an error information of input data in response to the write enable signal and then outputting an internal parity signal including the error information, and outputting internal data by delaying the input data in response to the write enable signal.

In an embodiment, a semiconductor device may include: a write read control circuit suitable for outputting a write enable signal and a read enable signal which are enabled in response to a write command and a read command, respectively, and a test mode signal; and an error correction circuit suitable for performing a first calculation operation of determining an error information of input data in response to the write enable signal and then outputting an internal parity signal including the error information, outputting internal data by delaying the input data in response to the write enable signal, and performing a second calculation operation of extracting an error correction information for correcting an error of the internal data from the internal parity signal in response to the read enable signal and then outputting output data by delaying the internal data.

According to the embodiments, by delaying data by a time for which an error correction operation is performed, advantages may be provided in that it is possible to secure the valid window of data in a write operation and a read operation.

Also, according to the embodiments, by delaying data by a time for which an error correction operation is performed, advantages may be provided in that it is possible to secure the margin of a strobe signal and data for performing a write operation and a read operation.

DETAILED DESCRIPTION

Hereinafter, a semiconductor device will be described below with reference to the accompanying drawings through various examples of embodiments.

Figure 1:
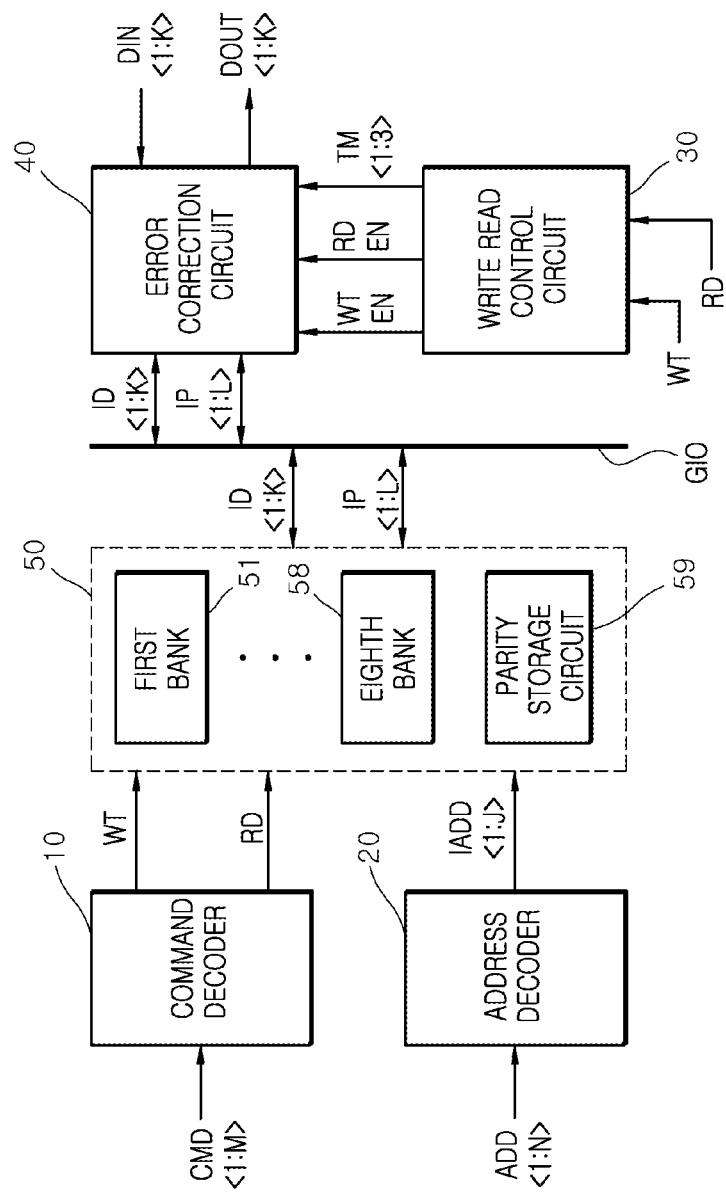
FIG. 1 is a block diagram illustrating a representation of an example of the configuration of a semiconductor device in accordance with an embodiment.

As shown in FIG. 1, a semiconductor device in accordance with an embodiment may include a command decoder 10, an address decoder 20, a write read control circuit 30, an error correction circuit 40, and a memory circuit 50.

The command decoder 10 may decode a command CMD<1:M>, and generate a write command WT and a read command RD. The command CMD<1:M> may be set as a signal inputted from a controller or test equipment which controls the semiconductor device. The command CMD<1: M> may be transmitted through lines through which at least one of an address, a command and data is transmitted. The bit number M of the command CMD<1:M> may be set as a natural number, and be set to various numbers of bits according to embodiments. The write command WT may be set as a command for entering a write operation. The read command RD may be set as a command for entering a read operation. While the command decoder 10 is embodied to generate the write command WT and the read command RD, the command decoder 10 may be embodied to generate various commands for entering various operations, according to embodiments.

The address decoder 20 may decode an address ADD<1:N>, and generate an internal address IADD<1:J>. The address ADD<1:N> may be set as a signal which is inputted from an exterior. The address ADD<1:N> may be transmitted through lines through which at least ones of an address, a command and data is transmitted. The bit number N of the address ADD<1:N> may be set as a natural number, and be set to various numbers of bits according to embodiments. The bit number J of the internal address IADD<1:J> may be set as a natural number, and be set to various numbers of bits according to embodiments. Some bits of the internal address IADD<1:J> may be set as an address for selecting first to eighth banks 51 to 58 included in the memory circuit 50. Some bits of the internal address IADD<1:J> may be set as an address for selecting a memory cell included in the first to eighth banks 51 to 58.

The write read control circuit 30 may generate a write enable signal WTEN which is enabled in response to the write command WT. The write read control circuit 30 may generate the write enable signal WTEN which includes a pulse generated in response to the write command WT. The write read control circuit 30 may generate a read enable signal RDEN which is enabled in response to the read command RD. The write read control circuit 30 may generate the read enable signal RDEN which includes a pulse generated in response to the read command RD. The write read control circuit 30 may generate a test mode signal TM<1:3> in response to the write command WT or the read command RD. The test mode signal TM<1:3> may be a signal which includes the time informations of a first calculation operation and a second calculation operation to be described below. The first calculation operation may be an operation for determining the error information of the input data DIN<1:K> by the error correction circuit 40 in a write operation. The second calculation operation may be an operation for correcting the error of internal data ID<1:K> by the error correction circuit 40 in a read operation.

The error correction circuit 40 may perform the first calculation operation of determining the error information of the input data DIN<1:K> in response to the write enable signal WTEN, and then, output an internal parity signal IP<1:L> which includes the error information. The error correction circuit 40 may output the internal parity signal IP<1:L> to an input/output line GIO in response to the write enable signal WTEN. The error correction circuit 40 may delay the input data DIN<1:K> by a delay amount set depending on a combination of the test mode signal TM<1:3>, in response to the write enable signal WTEN, and output the internal data ID<1:K>. The error correction circuit 40 may output the internal data ID<1:K> to the input/output line GIO in response to the write enable signal WTEN.

The error correction circuit 40 may perform the second calculation operation of correcting the error of internal data ID<1:K> in response to the read enable signal RDEN, and then, delay the internal data ID<1:K> and output output data DOUT<1:K>. The error correction circuit 40 may correct the error of the internal data ID<1:K> according to an internal parity signal IP<1:L> loaded on the input/output line GIO, in response to the read enable signal RDEN, and then, output the output data DOUT<1:K>. The error correction circuit 40 may delay the internal data ID<1:K> by a delay amount set depending on a combination of the test mode signal TM<1:3>, in response to the read enable signal RDEN, and output the output data DOUT<1:K>.

A delay amount in the case where the test mode signal TM<1> is enabled may be set as a smallest delay amount. A delay amount in the case where the test mode signal TM<2> is enabled may be set as a delay amount larger than the delay amount in the case where the test mode signal TM<1> is enabled. A delay amount in the case where the test mode signal TM<3> is enabled may be set as a delay amount larger than the delay amount in the case where the test mode signal TM<2> is enabled.

While the input/output line GIO is illustrated as one line, the input/output line GIO may be embodied to include a plurality of input/output lines. The bit number L of the internal parity signal IP<1:L> may be set variously to include the error information of the input data DIN<1:K>, according to embodiments. The bit number K of the input data DIN<1:K> and the internal data ID<1:K> may be set variously according to embodiments. The number of bits of the test mode signal TM<1:3> may be set variously according to embodiments.

The memory circuit 50 may include the first to eighth banks 51 to 58 and a parity storage circuit 59. The memory circuit 50 may store the internal data ID<1:K> loaded on the input/output line GIO, in the first to eighth banks 51 to 58 selected depending on a combination of the internal address IADD<1:J>, in response to the write command WT. The memory circuit 50 may output the internal data ID<1:K> stored in the first to eighth banks 51 to 58 selected depending on a combination of the internal address IADD<1:J>, to the input/output line GIO, in response to the read command RD. The memory circuit 50 may store the internal parity signal IP<1:L> loaded on the input/output line GIO, in the parity storage circuit 59, in response to the write command WT. The memory circuit 50 may output the internal parity signal IP<1:L> stored in the parity storage circuit 59, to the input/output line GIO, in response to the read command RD.

Figure 2:
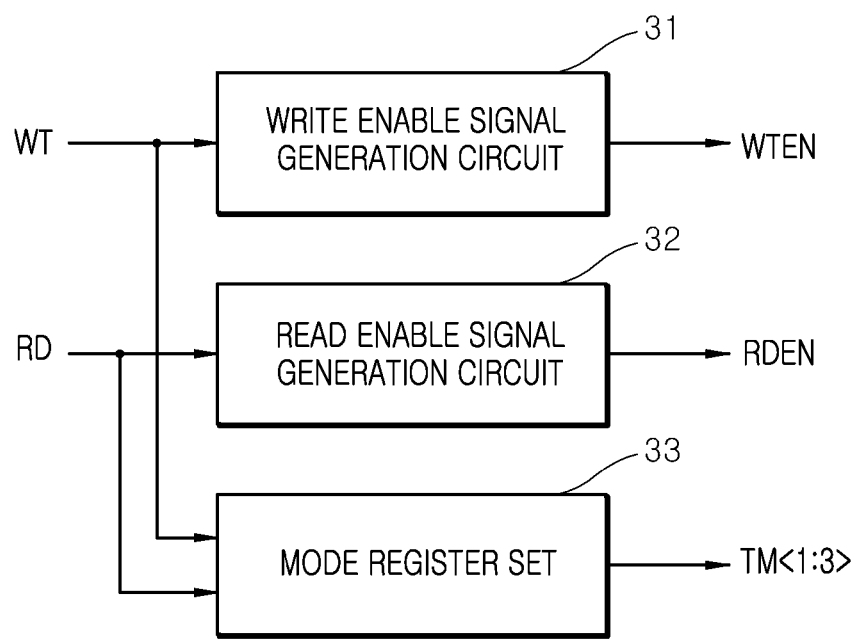
FIG. 2 is a block diagram illustrating a representation of an example of the configuration of the write read control circuit included in the semiconductor device shown in FIG. 1.

Referring to FIG. 2, the write read control circuit 30 may include a write enable signal generation circuit 31, a read enable signal generation circuit 32, and a mode register set 33.

The write enable signal generation circuit 31 may generate the write enable signal WTEN which is enabled in response to the write command WT. The write enable signal generation circuit 31 may generate the write enable signal WTEN which includes a pulse generated in response to the write command WT.

The read enable signal generation circuit 32 may generate the read enable signal RDEN which is enabled in response to the read command RD. The read enable signal generation circuit 32 may generate the read enable signal RDEN which includes a pulse generated in response to the read command RD.

The mode register set 33 may output the test mode signal TM<1:3> in response to the write command WT or the read command RD. The mode register set 33 may output the test mode signal TM<1:3> which includes the time information of the first calculation operation in response to the write command WT. The mode register set 33 may output the test mode signal TM<1:3> which includes the time information of the second calculation operation in response to the read command RD. The mode register set 33 may be embodied as a general mode register set (MRS) which includes a plurality of registers to control the operation of a semiconductor device.

Figure 3:
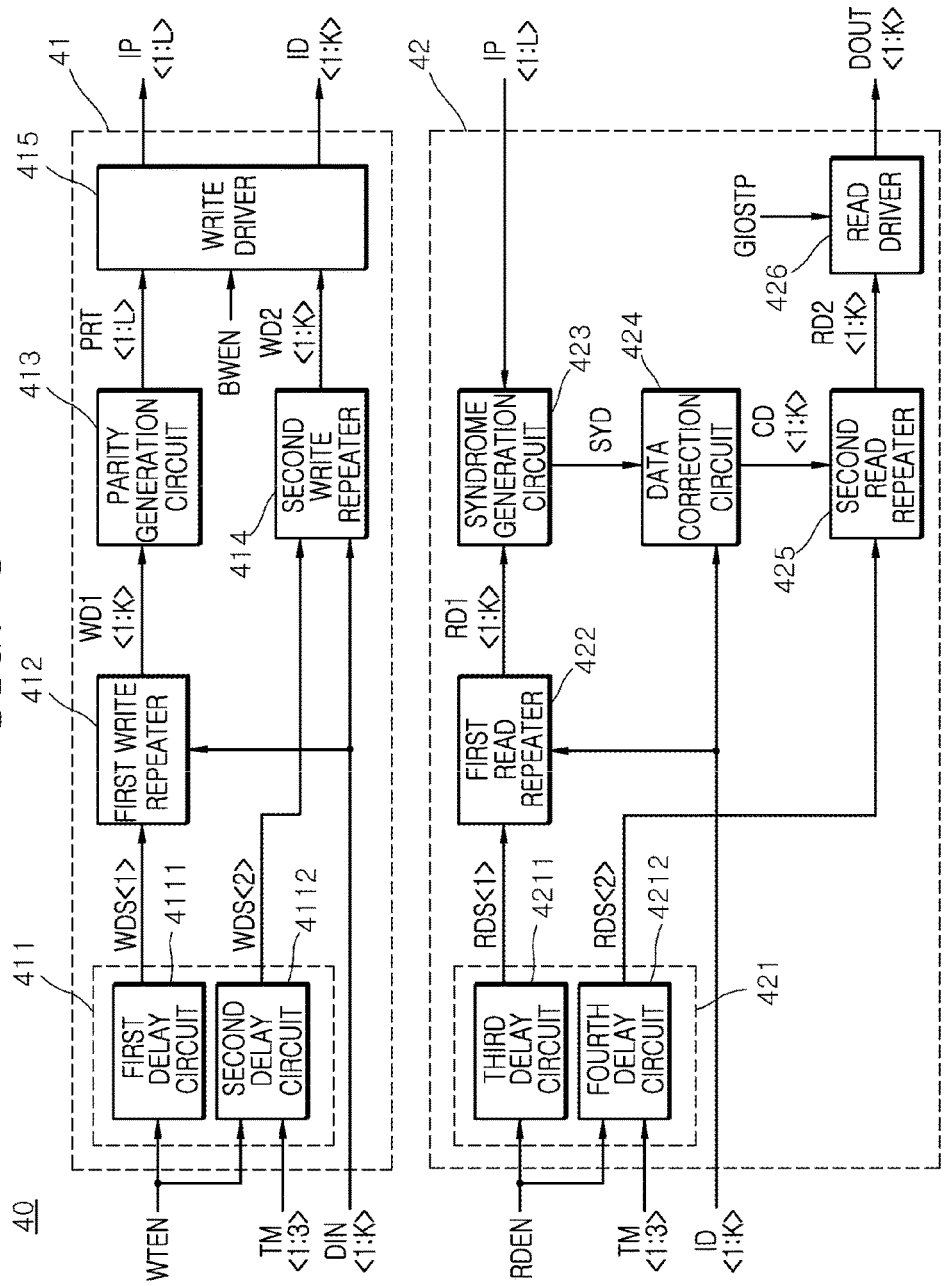
FIG. 3 is a block diagram illustrating a representation of an example of the configuration of the error correction circuit included in the semiconductor device shown in FIG. 1.

Referring to FIG. 3, the error correction circuit 40 may include a write error correction circuit 41 and a read error correction circuit 42.

The write error correction circuit 41 may include a write delay circuit 411, a first write repeater 412, a parity generation circuit 413, a second write repeater 414, and a write driver 415.

The write delay circuit 411 may include a first delay circuit 4111 and a second delay circuit 4112. The first delay circuit 4111 may delay the write enable signal WTEN by a first delay amount, and generate a first write delay signal WDS<1>. The second delay circuit 4112 may be set to a second delay amount according to the test mode signal TM<1:3>. The second delay circuit 4112 may delay the write enable signal WTEN by the second delay amount, and generate a second write delay signal WDS<2>. The second delay amount may be set to the same time as the above-described first calculation operation.

The first write repeater 412 may output the input data DIN<1:K> as first write data WD1<1:K> in response to the first write delay signal WDS<1>. The first write repeater 412 may drive the first write data WD1<1:K> in response to the input data DIN<1:K> at a point of time when the first write delay signal WDS<1> is enabled.

The parity generation circuit 413 may perform the first calculation operation of determining an error information for the first write data WD1<1:K>, and then, output a parity signal PRT<1:L>. The parity signal PRT<1:L> may be generated by employing the error correction code (ECC) scheme.

The second write repeater 414 may output the input data DIN<1:K> as second write data WD2<1:K> in response to the second write delay signal WDS<2>. The second write repeater 414 may drive the second write data WD2<1:K> in response to the input data DIN<1:K> at a point of time when the second write delay signal WDS<2> is enabled.

The write driver 415 may output the parity signal PRT<1:L> as the internal parity signal IP<1:L> in response to a write strobe signal BWEN. The write driver 415 may output the internal parity signal IP<1:L> to the input/output line GIO. The write driver 415 may output the second write data WD2<1:K> as the internal data ID<1:K> in response to the write strobe signal BWEN. The write driver 415 may output the internal data ID<1:K> to the input/output line GIO. The write strobe signal BWEN may be set as a signal for outputting the internal data ID<1:K> by driving the write driver 415 in a write operation.

As described above, the write error correction circuit 41 may perform the first calculation operation in response to the write enable signal WTEN and the test mode signal TM<1:3>, and then output the internal parity signal IP<1:L> and the internal data ID<1:K>. The write error correction circuit 41 may output the internal data ID<1:K> generated by delaying the input data DIN<1:K> according to the write enable signal WTEN and the test mode signal TM<1:3>, to the input/output line GIO. The write error correction circuit 41 may output the internal parity signal IP<1:L> including the error information of the input data DIN<1:K>, to the input/output line GIO.

The read error correction circuit 42 may include a read delay circuit 421, a first read repeater 422, a syndrome generation circuit 423, a data correction circuit 424, a second read repeater 425, and a read driver 426.

The read delay circuit 421 may include a third delay circuit 4211 and a fourth delay circuit 4212. The third delay circuit 4211 may delay the read enable signal RDEN by a third delay amount, and generate a first read delay signal RDS<1>. The fourth delay circuit 4212 may be set in a fourth delay amount according to the test mode signal TM<1:3>. The fourth delay circuit 4212 may delay the read enable signal RDEN by the fourth delay amount, and generate a second read delay signal RDS<2>. The fourth delay amount may be set to the same time as the above-described second calculation operation.

The first read repeater 422 may output the internal data ID<1:K> as first read data RD1<1:K> in response to the first read delay signal RDS<1>. The first read repeater 422 may drive the first read data RD1<1:K> in response to the internal data ID<1:K> at a point of time when the first read delay signal RDS<1> is enabled.

The syndrome generation circuit 423 may perform the second calculation operation of determining an error correction information for the first read data RD1<1:K>, from the internal parity signal IP<1:L>, and then, output a syndrome SYD. While the syndrome SYD is illustrated as one signal, the syndrome SYD may be generated as a plurality of bits including an information for correcting an error for the first read data RD1<1:K>. The syndrome SYD may be generated by employing the error correction code (ECC) scheme.

The data correction circuit 424 may correct the error of the internal data ID<1:K> in response to the syndrome SYD, and output corrected data CD<1:K>. The data correction circuit 424 may output the corrected data CD<1:K> by inverting a bit of the internal data ID<1:K> in which an error has occurred, according to the syndrome SYD.

The second read repeater 425 may output the corrected data CD<1:K> as second read data RD2<1:K> in response to the second read delay signal RDS<2>. The second read repeater 425 may drive the second read data RD2<1:K> in response to the corrected data CD<1:K> at a point of time when the second read delay signal RDS<2> is enabled.

The read driver 426 may output the second read data RD2<1:K> as the output data DOUT<1:K> in response to a read strobe signal GIOSTP. The read strobe signal GIOSTP may be set as a signal for outputting the output data DOUT<1:K> by driving the read driver 426 in a read operation.

Figure 4:
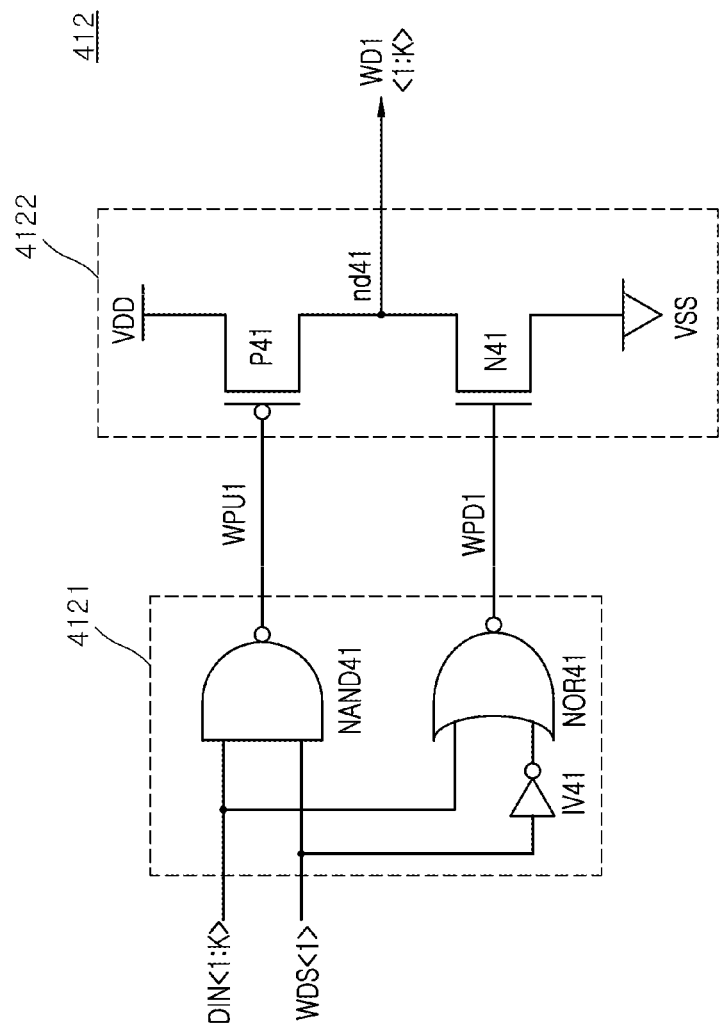
FIG. 4 is a circuit diagram illustrating a representation of an example of the configuration of the first write repeater included in the error correction circuit shown in FIG. 3.

Referring to FIG. 4, the first write repeater 412 may include a first logic circuit 4121 and a first driving circuit 4122.

The first logic circuit 4121 may be embodied by an inverter IV41, a NAND gate NAND41, and a NOR gate NOR41. The first logic circuit 4121 may generate a first write pull-up signal WPU1 and a first write pull-down signal WPD1 depending on the logic level of the input data DIN<1:K> in response to the first write delay signal WDS<1>. The first logic circuit 4121 may generate the first write pull-up signal WPU1 which is enabled to a logic low level, in the case where the logic level of the input data DIN<1:K> is a logic high level at a point of time when the first write delay signal WDS<1> is inputted at a logic high level. The first logic circuit 4121 may generate the first write pull-down signal WPD1 which is enabled to a logic high level, in the case where the logic level of the input data DIN<1:K> is a logic low level at a point of time when the first write delay signal WDS<1> is inputted at the logic high level.

The first driving circuit 4122 may be embodied by a PMOS transistor P41 which is coupled between a power supply voltage VDD and a node nd41 and an NMOS transistor N41 which is coupled between the node nd41 and a ground voltage VSS. The first driving circuit 4122 may pull-up drive the node nd41 and generate the first write data WD1<1:K> of a logic high level, in the case where the first write pull-up signal WPU1 is enabled to the logic low level. The first driving circuit 4122 may pull-down drive the node nd41 and generate the first write data WD1<1:K> of a logic low level, in the case where the first write pull-down signal WPD1 is enabled to the logic high level.

While the first write repeater 412 shown in FIG. 4 is illustrated as one circuit, the first write repeater 412 may be embodied by K number of circuits in correspondence to the number of bits of the input data DIN<1:K> and the first write data WD1<1:K>.

Figure 5:
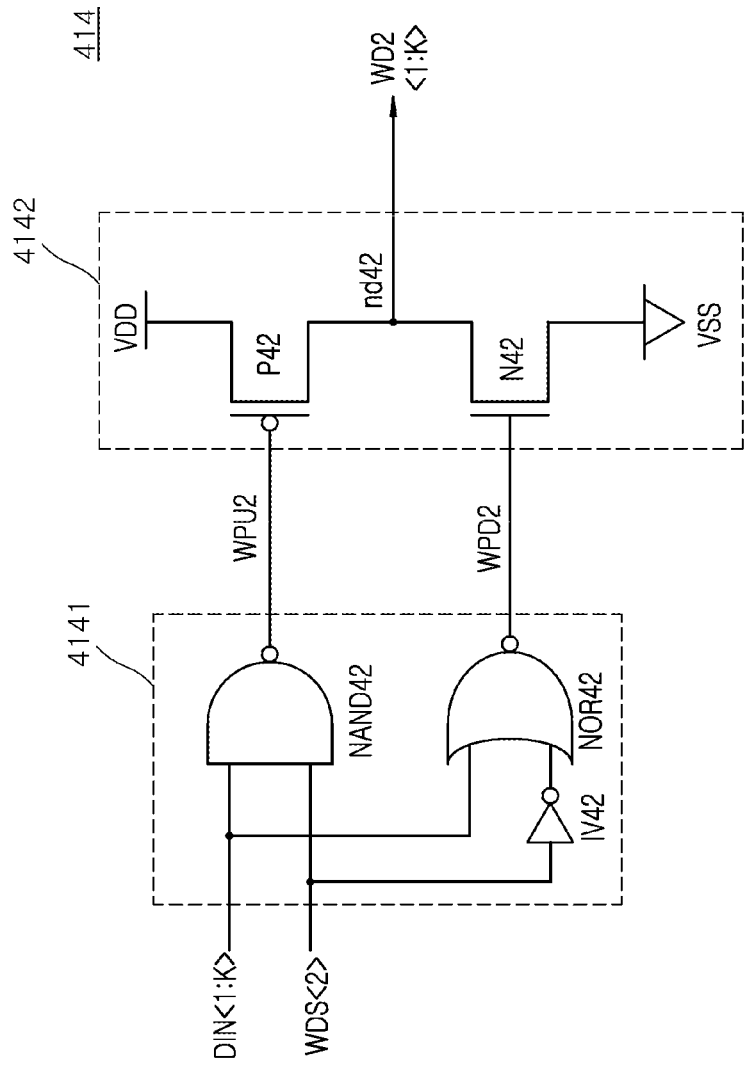
FIG. 5 is a circuit diagram illustrating a representation of an example of the configuration of the second write repeater included in the error correction circuit shown in FIG. 3.

Referring to FIG. 5, the second write repeater 414 may include a second logic circuit 4141 and a second driving circuit 4142.

The second logic circuit 4141 may be embodied by an inverter IV42, a NAND gate NAND42, and a NOR gate NOR42. The second logic circuit 4141 may generate a second write pull-up signal WPU2 and a second write pull-down signal WPD2 depending on the logic level of the input data DIN<1:K> in response to the second write delay signal WDS<2>. The second logic circuit 4141 may generate the second write pull-up signal WPU2 which is enabled to a logic low level, in the case where the logic level of the input data DIN<1:K> is the logic high level at a point of time when the second write delay signal WDS<2> is inputted at a logic high level. The second logic circuit 4141 may generate the second write pull-down signal WPD2 which is enabled to a logic high level, in the case where the logic level of the input data DIN<1:K> is the logic low level at a point of time when the second write delay signal WDS<2> is inputted at the logic high level.

The second driving circuit 4142 may be embodied by a PMOS transistor P42 which is coupled between the power supply voltage VDD and a node nd42 and an NMOS transistor N42 which is coupled between the node nd42 and the ground voltage VSS. The second driving circuit 4142 may pull-up drive the node nd42 and generate the second write data WD2<1:K> of a logic high level, in the case where the second write pull-up signal WPU2 is enabled to the logic low level. The second driving circuit 4142 may pull-down drive the node nd42 and generate the second write data WD2<1:K> of a logic low level, in the case where the second write pull-down signal WPD2 is enabled to the logic high level.

While the second write repeater 414 shown in FIG. 5 is illustrated as one circuit, the second write repeater 414 may be embodied by K number of circuits in correspondence to the number of bits of the input data DIN<1:K> and the second write data WD2<1:K>.

Figure 6:
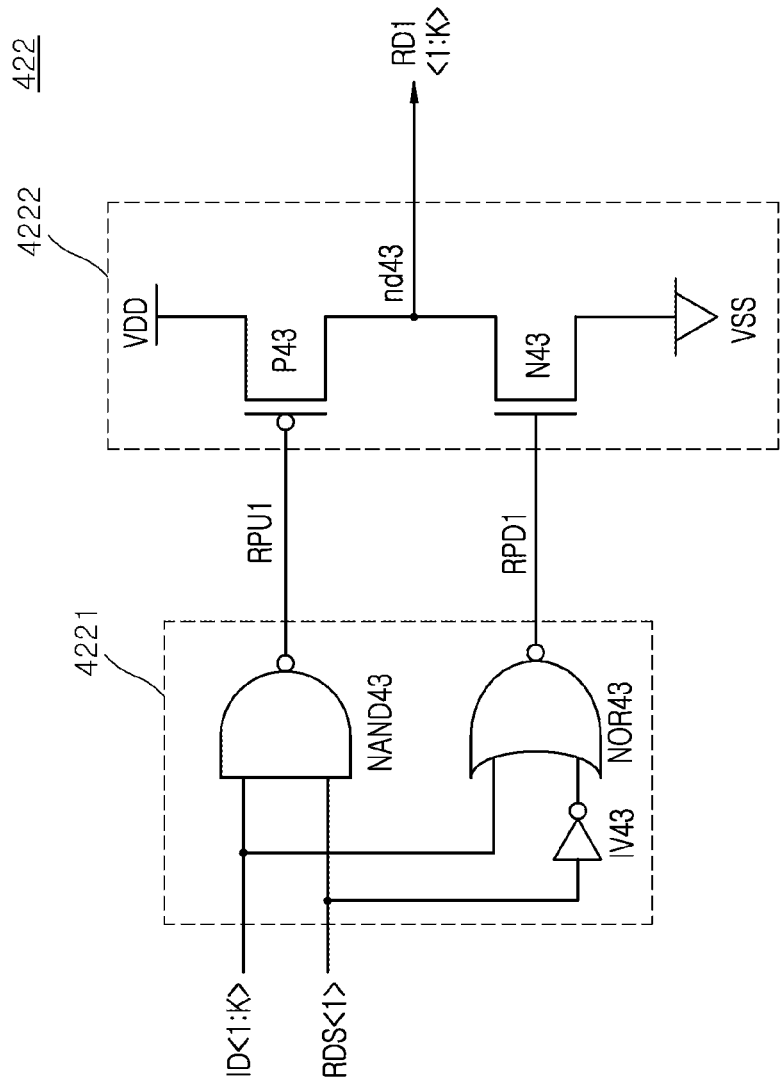
FIG. 6 is a circuit diagram illustrating a representation of an example of the configuration of the first read repeater included in the error correction circuit shown in FIG. 3.

Referring to FIG. 6, the first read repeater 422 may include a third logic circuit 4221 and a third driving circuit 4222.

The third logic circuit 4221 may be embodied by an inverter IV43, a NAND gate NAND43, and a NOR gate NOR43. The third logic circuit 4221 may generate a first read pull-up signal RPU1 and a first read pull-down signal RPD1 depending on the logic level of the internal data ID<1:K> in response to the first read delay signal RDS<1>. The third logic circuit 4221 may generate the first read pull-up signal RPU1 which is enabled to a logic low level, in the case where the logic level of the internal data ID<1:K> is a logic high level at a point of time when the first read delay signal RDS<1> is inputted at a logic high level. The third logic circuit 4221 may generate the first read pull-down signal RPD1 which is enabled to a logic high level, in the case where the logic level of the internal data ID<1:K> is a logic low level at a point of time when the first read delay signal RDS<1> is inputted at the logic high level.

The third driving circuit 4222 may be embodied by a PMOS transistor P43 which is coupled between the power supply voltage VDD and a node nd43 and an NMOS transistor N43 which is coupled between the node nd43 and the ground voltage VSS. The third driving circuit 4222 may pull-up drive the node nd43 and generate the first read data RD1<1:K> of a logic high level, in the case where the first read pull-up signal RPU1 is enabled to the logic low level. The third driving circuit 4222 may pull-down drive the node nd43 and generate the first read data RD1<1:K> of a logic low level, in the case where the first read pull-down signal RPD1 is enabled to the logic high level.

While the first read repeater 422 shown in FIG. 6 is illustrated as one circuit, the first read repeater 422 may be embodied by K number of circuits in correspondence to the number of bits of the internal data ID<1:K> and the first read data RD1<1:K>.

Figure 7:
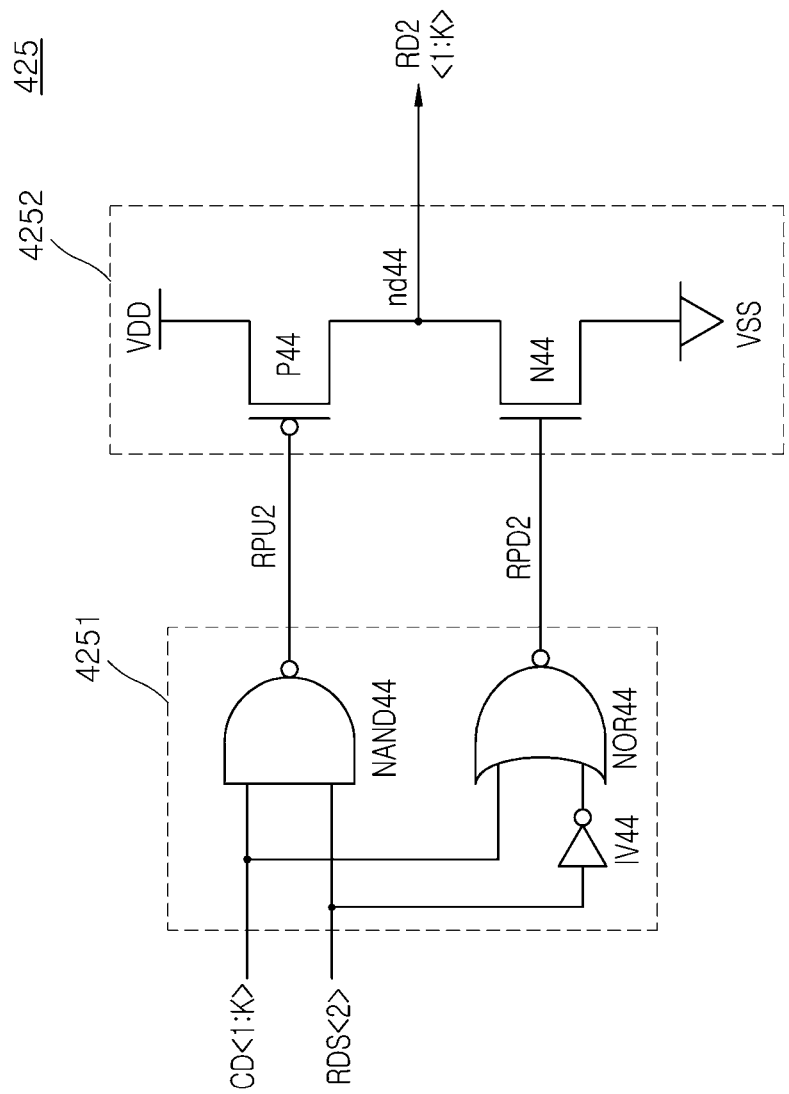
FIG. 7 is a circuit diagram illustrating a representation of an example of the configuration of the second read repeater included in the error correction circuit shown in FIG. 3.

Referring to FIG. 7, the second read repeater 425 may include a fourth logic circuit 4251 and a fourth driving circuit 4252.

The fourth logic circuit 4251 may be embodied by an inverter IV44, a NAND gate NAND44, and a NOR gate NOR44. The fourth logic circuit 4251 may generate a second read pull-up signal RPU2 and a second read pull-down signal RPD2 depending on the logic level of the corrected data CD<1:K> in response to the second read delay signal RDS<2>. The fourth logic circuit 4251 may generate the second read pull-up signal RPU2 which is enabled to a logic low level, in the case where the logic level of the corrected data CD<1:K> is a logic high level at a point of time when the second read delay signal RDS<2> is inputted at a logic high level. The fourth logic circuit 4251 may generate the second read pull-down signal RPD2 which is enabled to a logic high level, in the case where the logic level of the corrected data CD<1:K> is a logic low level at a point of time when the second read delay signal RDS<2> is inputted at the logic high level.

The fourth driving circuit 4252 may be embodied by a PMOS transistor P44 which is coupled between the power supply voltage VDD and a node nd44 and an NMOS transistor N44 which is coupled between the node nd44 and the ground voltage VSS. The fourth driving circuit 4252 may pull-up drive the node nd44 and generate the second read data RD2<1:K> of a logic high level, in the case where the second read pull-up signal RPU2 is enabled to the logic low level. The fourth driving circuit 4252 may pull-down drive the node nd44 and generate the second read data RD2<1:K> of a logic low level, in the case where the second read pull-down signal RPD2 is enabled to the logic high level.

While the second read repeater 425 shown in FIG. 7 is illustrated as one circuit, the second read repeater 425 may be embodied by K number of circuits in correspondence to the number of bits of the corrected data CD<1:K> and the second read data RD2<1:K>.

Figure 8:
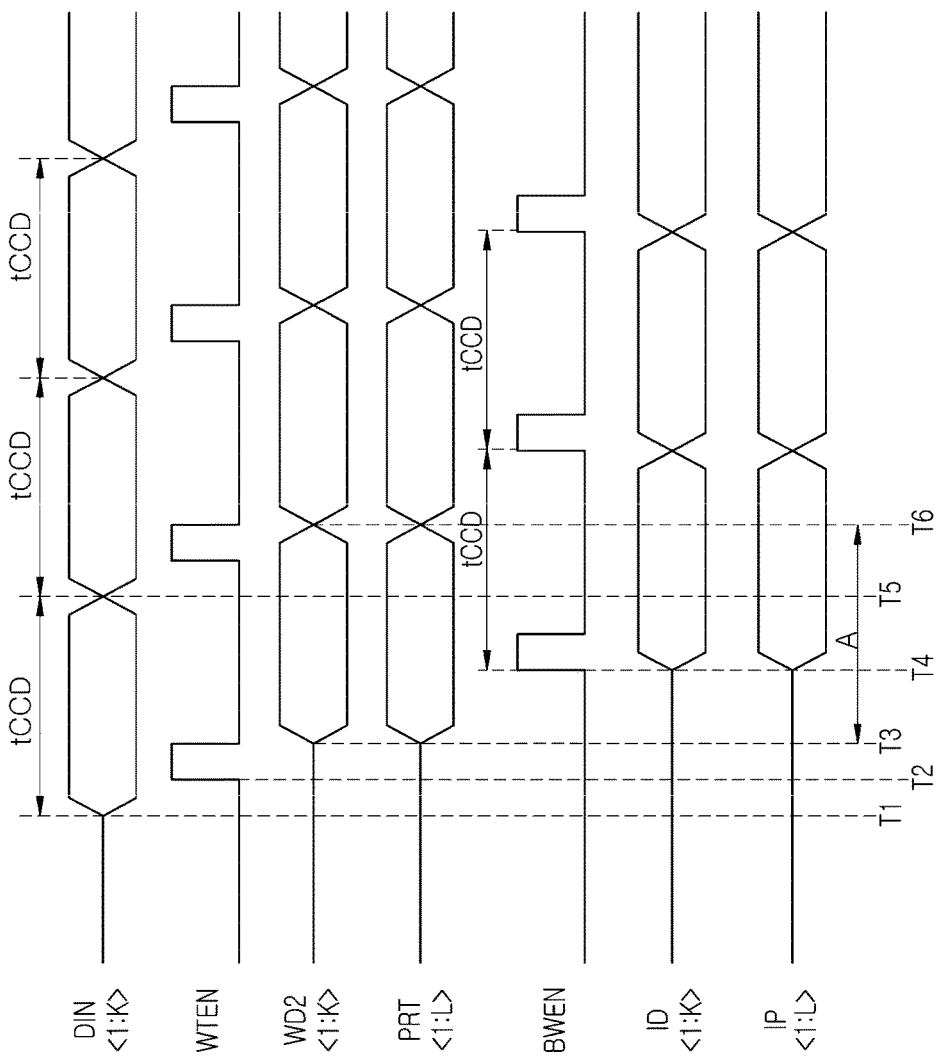
FIGS. 8 and 9 are representations of examples of timing diagrams to assist in the explanation of operations of the semiconductor device in accordance with the embodiment.

The write operation of the semiconductor device in accordance with the embodiment will be described with reference to FIG. 8 by exemplifying a write operation for the first bank 51.

The command decoder 10 decodes the command CMD<1:M> and generates the write command WT.

The address decoder 20 decodes the address ADD<1:N> and generates the internal address IADD<1:J> for selecting the first bank 51.

At a point of time T1, the input data DIN<1:K> is inputted. The input data DIN<1:K> may be inputted with the cycle of a tCCD (CAS to CAS delay), and the tCCD means an interval between initiations of each of consecutive write operations. The tCCD shown in FIG. 8 is set from the point of time T1 to a point of time T5.

At a point of time T2, the write enable signal generation circuit 31 of the write read control circuit 30 generates the write enable signal WTEN which includes a pulse generated in response to the write command WT. The mode register set 33 outputs the test mode signal TM<1:3> in response to the write command WT.

The write delay circuit 411 of the write error correction circuit 41 delays the write enable signal WTEN by the first delay amount, and generates the first write delay signal WDS<1>.

The first write repeater 412 outputs the input data DIN<1:K> as the first write data WD1<1:K> in response to the first write delay signal WDS<1>.

At a point of time T3, the parity generation circuit 413 performs the first calculation operation of determining an error information for the first write data WD1<1:K>, and then, outputs the parity signal PRT<1:L>. The parity signal PRT<1:L> is generated from the point of time T3 to a point of time T6, and a period A from the point of time T3 to the point of time T6 is set as the same period as the tCCD.

The write delay circuit 411 delays the write enable signal WTEN by the second delay amount set depending on the test mode signal TM<1:3>, and generates the second write delay signal WDS<2>.

The second write repeater 414 outputs the input data DIN<1:K> as the second write data WD2<1:K> in response to the second write delay signal WDS<2>. The second write data WD2<1:K> is generated from the point of time T3 to the point of time T6, and the period A from the point of time T3 to the point of time T6 is set as the same period as the tCCD.

At a point of time T4, the write driver 415 outputs the parity signal PRT<1:L> as the internal parity signal IP<1:L> in synchronization with the write strobe signal BWEN. The write driver 415 outputs the internal parity signal IP<1:L> to the input/output line GIO. The write driver 415 outputs the second write data WD2<1:K> as the internal data ID<1:K>. The write driver 415 outputs the internal data ID<1:K> to the input/output line GIO. The write strobe signal BWEN is inputted with the cycle of the tCCD in consecutive write operations.

No matter at which point of time the write strobe signal BWEN is inputted during the period A from the point of time T3 to the point of time T6, which is the valid window of the second write data WD2<1:K> and the parity signal PRT<1:L>, it is possible to properly generate the internal data ID<1:K> and the internal parity signal IP<1:L>, and thereby to secure the margin of a write strobe signal and input data for performing a write operation.

The first bank 51 of the memory circuit 50 stores the internal data ID<1:K> loaded on the input/output line GIO, in a memory cell selected by the internal address IADD<1:J>, in response to the write command WT. The parity storage circuit 59 stores the internal parity signal IP<1:L> loaded on the input/output line GIO, in response to the write command WT.

As is apparent from the above descriptions, in the semiconductor device in accordance with the embodiment, through delaying input data by a period for which an error correction operation is performed in a write operation, it is possible to secure the valid window of the input data. Moreover, in the semiconductor device in accordance with the embodiment, through delaying input data by a period for which an error correction operation is performed, it is possible to secure the margin of a write strobe signal and input data for performing a write operation.

Figure 9:
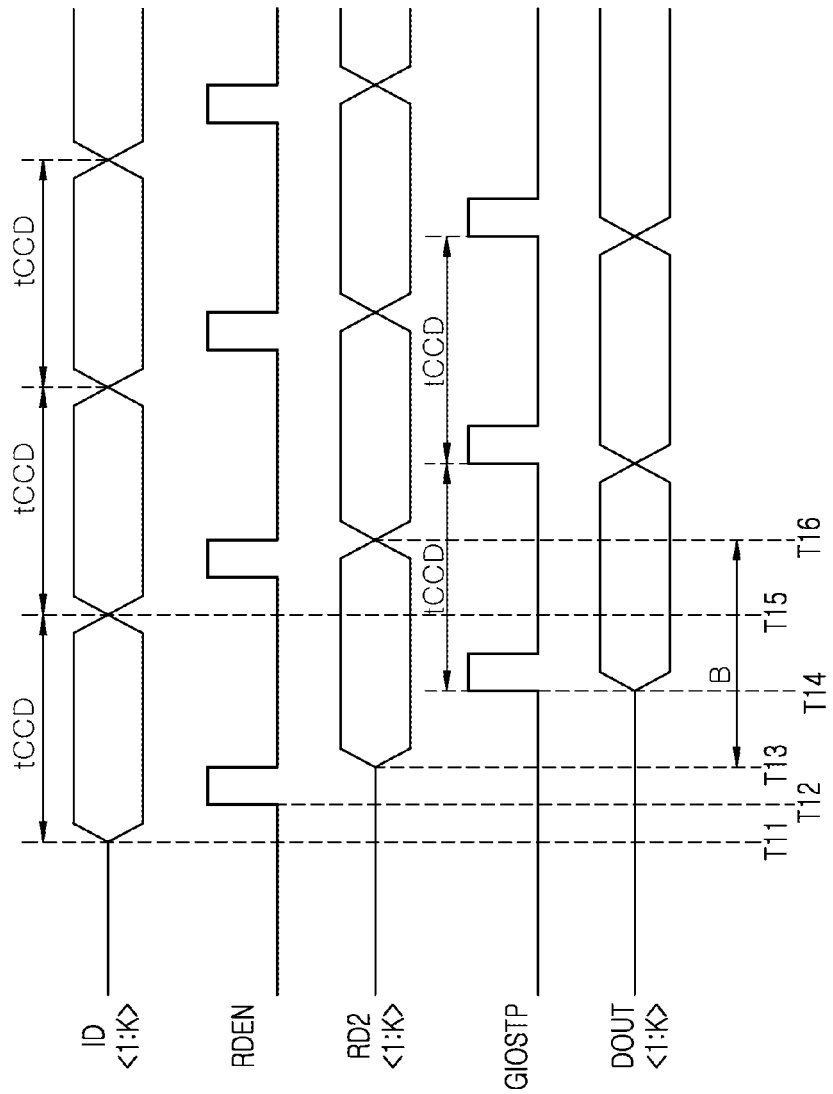

The read operation of the semiconductor device in accordance with the embodiment will be described with reference to FIG. 9 by exemplifying a read operation for the first bank 51.

The command decoder 10 decodes the command CMD<1:M> and generates the read command RD.

The address decoder 20 decodes the address ADD<1:N> and generates the internal address IADD<1:J> for selecting the first bank 51.

At a point of time T11, the first bank 51 outputs the internal data ID<1:K> stored in a memory cell selected by the internal address IADD<1:J>, in response to the read command RD. The first bank 51 outputs the internal data ID<1:K> to the input/output line GIO. The parity storage circuit 59 outputs the internal parity signal IP<1:L> stored therein, to the input/output line GIO, in response to the read command RD. The internal data ID<1:K> may be outputted with the cycle of a tCCD (CAS to CAS delay), and the tCCD means an interval between initiations of each of consecutive read operations. The tCCD shown in FIG. 9 is set from the point of time T11 to a point of time T15.

At a point of time T12, the read enable signal generation circuit 32 of the write read control circuit 30 generates the read enable signal RDEN which includes a pulse generated in response to the read command RD. The mode register set 33 outputs the test mode signal TM<1:3> in response to the read command RD.

The read delay circuit 421 of the read error correction circuit 42 delays the read enable signal RDEN by the third delay amount, and generates the first read delay signal RDS<1>.

The first read repeater 422 outputs the internal data ID<1:K> as the first read data RD1<1:K> in response to the first read delay signal RDS<1>.

At a point of time T13, the syndrome generation circuit 423 performs the second calculation operation of extracting an error correction information for the first read data RD1<1:K>, from the internal parity signal IP<1:L>, and then, outputs the syndrome SYD.

The data correction circuit 424 corrects the error of the internal data ID<1:K> in response to the syndrome SYD, and outputs the corrected data CD<1:K>.

The second read repeater 425 outputs the corrected data CD<1:K> as the second read data RD2<1:K> in response to the second read delay signal RDS<2>.

The corrected data CD<1:K> and the second read data RD2<1:K> are generated from the point of time T13 to a point of time T16, and a period B from the point of time T13 to the point of time T16 is set as the same period as the tCCD.

At a point of time T14, the read driver 426 outputs the second read data RD2<1:K> as the output data DOUT<1:K> in response to the read strobe signal GIOSTP.

The read strobe signal GIOSTP is inputted with the cycle of the tCCD in consecutive read operations.

No matter at which point of time the read strobe signal GIOSTP is inputted during the period B from the point of time T13 to the point of time T16, which is the valid window of the second read data RD2<1:K>, it is possible to generate the output data DOUT<1:K>, and thereby to secure the margin of a read strobe signal and internal data for performing a read operation.

As is apparent from the above descriptions, in the semiconductor device in accordance with the embodiment, through delaying internal data by a period for which an error correction operation is performed in a read operation, it is possible to secure the valid window of the internal data. Moreover, in the semiconductor device in accordance with the embodiment, through delaying internal data by a period for which an error correction operation is performed, it is possible to secure the margin of a read strobe signal and internal data for performing a read operation.

Figure 10:
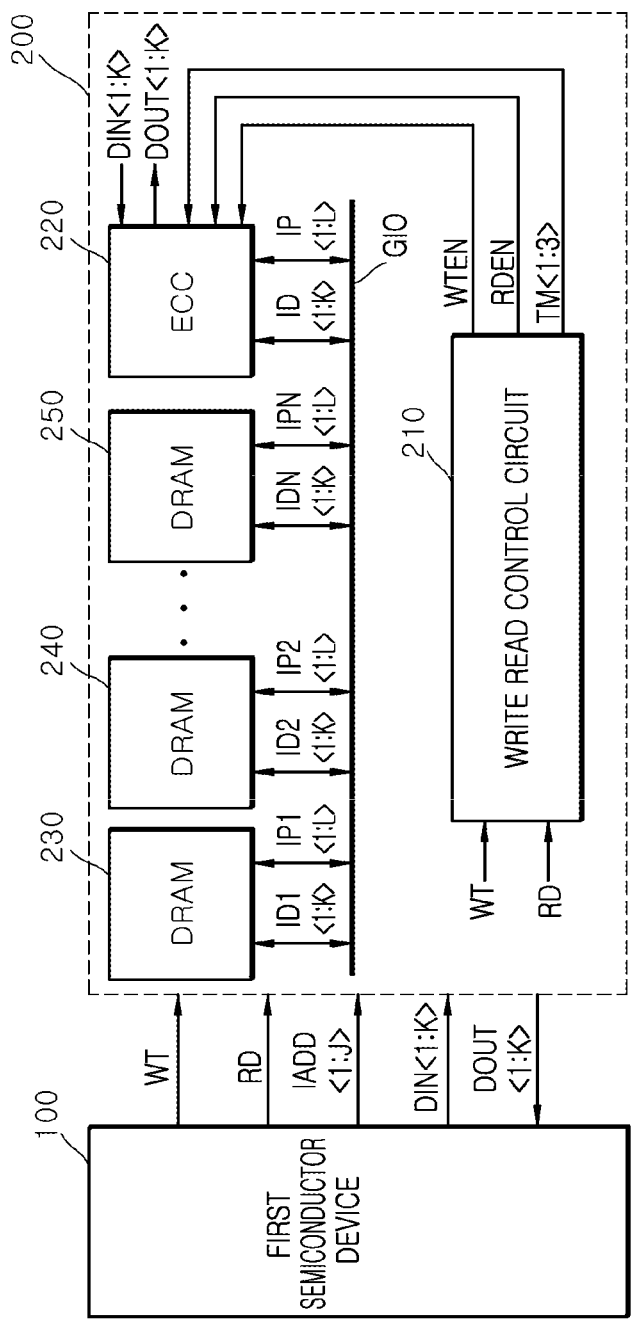
FIG. 10 is a block diagram illustrating a representation of an example of the configuration of a semiconductor system in accordance with an embodiment.

Referring to FIG. 10, a semiconductor system in accordance with an embodiment may include a first semiconductor device 100 and a second semiconductor device 200.

The first semiconductor device 100 may generate a write command WT and a read command RD. The first semiconductor device 100 may output input data DIN<1:K>. The first semiconductor device 100 may receive output data DOUT<1:K>. The write command WT may be set as a command for entering a write operation. The read command RD may be set as a command for entering a read operation. The first semiconductor device 100 may include the command decoder 10 and the address decoder 20 shown in FIG. 1.

The second semiconductor device 200 may include a write read control circuit 210, an error correction circuit 220, and a plurality of memory circuits 230 to 250.

The write read control circuit 210 may generate a write enable signal WTEN which is enabled in response to the write command WT. The write read control circuit 210 may generate the write enable signal WTEN which includes a pulse generated in response to the write command WT. The write read control circuit 210 may generate a read enable signal RDEN which is enabled in response to the read command RD. The write read control circuit 210 may generate the read enable signal RDEN which includes a pulse generated in response to the read command RD. The write read control circuit 210 may generate a test mode signal TM<1:3> in response to the write command WT or the read command RD. The write read control circuit 210 may be embodied by the write read control circuit 30 shown in FIG. 1.

The error correction circuit 220 may perform a first calculation operation of determining the error information of the input data DIN<1:K> in response to the write enable signal WTEN, and then, output an internal parity signal IP<1:L> which includes the error information. The error correction circuit 220 may output the internal parity signal IP<1:L> to an input/output line GIO in response to the write enable signal WTEN. The error correction circuit 220 may delay the input data DIN<1:K> by a delay amount set depending on a combination of the test mode signal TM<1:3>, in response to the write enable signal WTEN, and output internal data ID<1:K>. The error correction circuit 220 may output the internal data ID<1:K> to the input/output line GIO in response to the write enable signal WTEN.

The error correction circuit 220 may perform a second calculation operation of correcting the error of internal data ID<1:K> in response to the read enable signal RDEN, and then, delay the internal data ID<1:K> and output the output data DOUT<1:K>. The error correction circuit 220 may correct the error of the internal data ID<1:K> according to an internal parity signal IP<1:L> loaded on the input/output line GIO, in response to the read enable signal RDEN, and then, output the output data DOUT<1:K>. The error correction circuit 220 may delay the internal data ID<1:K> by a delay amount set depending on a combination of the test mode signal TM<1:3>, in response to the read enable signal RDEN, and output the output data DOUT<1:K>. The error correction circuit 220 may be embodied by the error correction circuit 40 shown in FIG. 1.

A first memory circuit 230 may store the internal data ID<1:K> loaded on the input/output line GIO, as first internal data ID1<1:K>, depending on a combination of an internal address IADD<1:J> in response to the write command WT. The first memory circuit 230 may output stored first internal data ID1<1:K> to the input/output line GIO, depending on a combination of the internal address IADD<1:J> in response to the read command RD. The first memory circuit 230 may store the internal parity signal IP<1:L> loaded on the input/output line GIO, as a first internal parity signal IP1<1:L>, in response to the write command WT. The first memory circuit 230 may output a stored first internal parity signal IP1<1:L> to the input/output line GIO in response to the read command RD.

A second memory circuit 240 may store the internal data ID<1:K> loaded on the input/output line GIO, as second internal data ID2<1:K>, depending on a combination of the internal address IADD<1:J> in response to the write command WT. The second memory circuit 240 may output stored second internal data ID2<1:K> to the input/output line GIO, depending on a combination of the internal address IADD<1:J> in response to the read command RD. The second memory circuit 240 may store the internal parity signal IP<1:L> loaded on the input/output line GIO, as a second internal parity signal IP2<1:L>, in response to the write command WT. The second memory circuit 240 may output a stored second internal parity signal IP2<1:L> to the input/output line GIO in response to the read command RD.

An $N^{th}$ memory circuit 250 may store the internal data ID<1:K> loaded on the input/output line GIO, as $N^{th}$ internal data IDN<1:K>, depending on a combination of the internal address IADD<1:J> in response to the write command WT. The $N^{th}$ memory circuit 250 may output stored $N^{th}$ internal data IDN<1:K> to the input/output line GIO, depending on a combination of the internal address IADD<1:J> in response to the read command RD. The $N^{th}$ memory circuit 250 may store the internal parity signal IP<1:L> loaded on the input/output line GIO, as an $N^{th}$ internal parity signal IPN<1:L>, in response to the write command WT. The $N^{th}$ memory circuit 250 may output a stored $N^{th}$ internal parity signal IPN<1:L> to the input/output line GIO in response to the read command RD.

Each of the first to $N^{th}$ memory circuits 230 to 250 may be embodied by the memory circuit 50 shown in FIG. 1. Moreover, the number of the first to $N^{th}$ memory circuits 230 to 250 included in the second semiconductor device 200 may be set variously according to an embodiment.

The semiconductor system illustrated in FIG. 10 may be embodied as a semiconductor module according to an embodiment.

Figure 11:
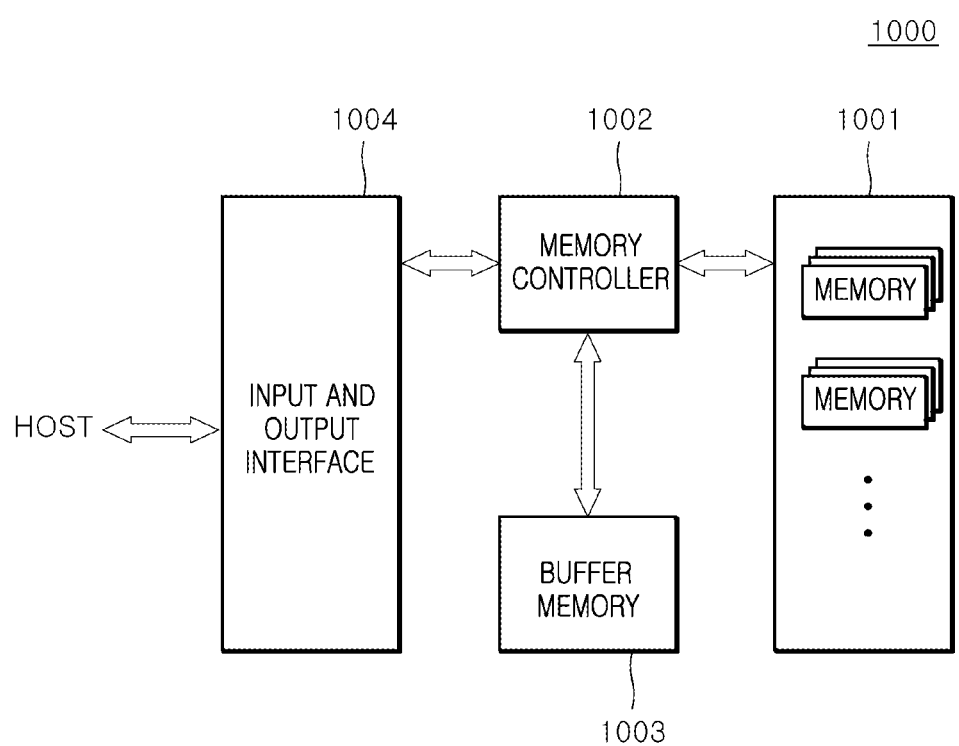
FIG. 11 is a diagram illustrating a representation of an example of the configuration of an electronic system to which the semiconductor device and the semiconductor system shown in FIGS. 1 to 10 are applied.

The semiconductor device and the semiconductor system described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1 or the second semiconductor device 200 shown in FIG. 10. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 100 shown in FIG. 10. While the memory controller 1002 is illustrated as one block in FIG. 11, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

Figure 12:
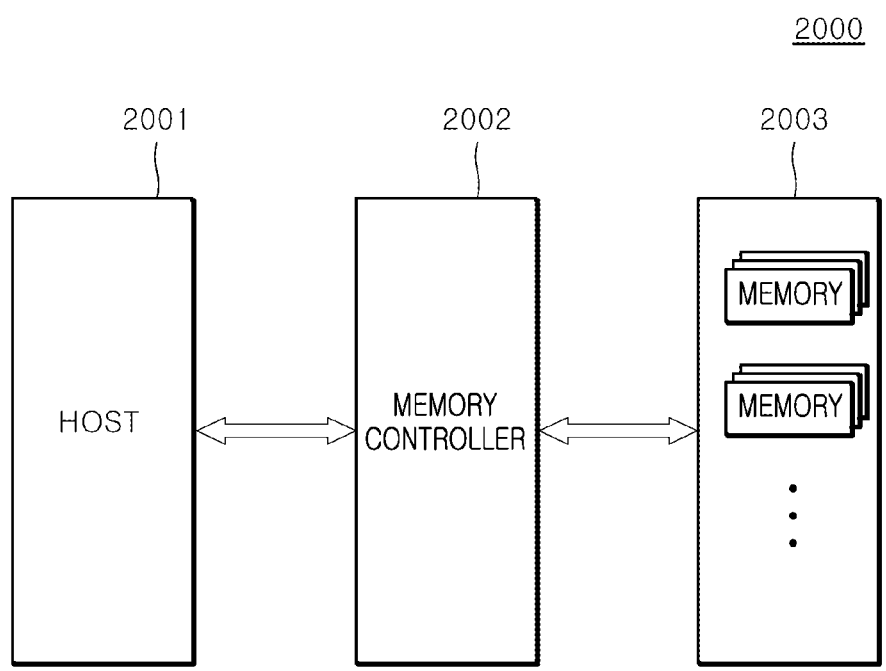
FIG. 12 is a diagram illustrating a representation of an example of the configuration of an electronic system to which the semiconductor device and the semiconductor system shown in FIGS. 1 to 10 are applied.

Referring to FIG. 12, an electronic system 2000 in accordance with another embodiment may include a host 2001, a memory controller 2002, and a data storage 2003.

The host 2001 may transmit a request and data to the memory controller 2002 to access the data storage 2003. The memory controller 2002 may provide data, a data strobe, a command, an address and a clock to the data storage 2003 in response to the request, and in response to this, the data storage 2003 may perform a write or read operation. The host 2001 may transmit data to the memory controller 2002 to store the data in the data storage 2003. Also, the host 2001 may receive, through the memory controller 2002, the data outputted from the data storage 2003. The host 2001 may include a circuit which corrects an error included in data, by using an error correction code (ECC) scheme. The host 2001 may include the error correction circuit 40 shown in FIG. 1 or the error correction circuit 220 shown in FIG. 10.

The memory controller 2002 may relay communication between the host 2001 and the data storage 2003. The memory controller 2002 may receive a request and data from the host 2002. In order to control the operation of the data storage 2003, the memory controller 2002 may generate data, a data strobe, a command, an address and a clock, and provide them to the data storage 2003. The memory controller 2002 may provide the data outputted from the data storage 2003, to the host 2001.

The data storage 2003 may include a plurality of memories. The data storage 2003 may receive data, a data strobe, a command, an address and a clock from the memory controller 2002, and perform a write or read operation. Each of the plurality of memories included in the data storage 2003 may include a circuit which corrects an error included in data, by using the error correction code (ECC) scheme. The data storage 2003 may include the error correction circuit 40 shown in FIG. 1 or the error correction circuit 220 shown in FIG. 10.

The error correction circuit included in the host 2001 and the error correction circuits included in the plurality of memories in the data storage 2003 may be realized to operate all together or operate selectively, according to embodiments. The host 2001 and the memory controller 2002 may be realized by the same chip according to an embodiment. The memory controller 2002 and the data storage 2003 may be realized by the same chip according to an embodiment.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a write read control circuit suitable for outputting a write enable signal and a test mode signal in response to a write command; and
   an error correction circuit suitable for performing a calculation operation of determining error information of input data in response to the write enable signal, outputting an internal parity signal including the error information, and outputting internal data by delaying the input data in response to the write enable signal,
   wherein the test mode signal is a signal which includes time information of the calculation operation.

2. The semiconductor device according to claim 1, wherein the internal data is outputted by being delayed by a time for the calculation operation indicated by the test mode signal.

3. The semiconductor device according to claim 1, wherein the write read control circuit comprises:
   a write enable signal generation circuit suitable for generating the write enable signal including a pulse generated in response to the write command; and
   a mode register set suitable for outputting the test mode signal including a time information of the calculation operation in response to the write command.

4. The semiconductor device according to claim 1, wherein the error correction circuit comprises:
   a write delay circuit suitable for generating a first write delay signal by delaying the write enable signal by a first delay amount, and generating a second write delay signal by delaying the write enable signal by a second delay amount;

a first write repeater suitable for driving first write data in response to the input data at a point of time when the first write delay signal is enabled;

a parity generation circuit suitable for outputting a parity signal after performing the calculation operation of determining the error information using the first write data;

a second write repeater suitable for driving second write data in response to the input data at a point of time when the second write delay signal is enabled; and a write driver suitable for outputting the parity signal as the internal parity signal in response to a write strobe signal, and outputting the second write data as the internal data in response to the write strobe signal.

5. The semiconductor device according to claim 4, wherein the second delay amount is larger than the first delay amount and is set as a same delay time as the calculation operation.

6. The semiconductor device according to claim 4, wherein the write delay circuit comprises:

a first delay circuit suitable for generating the first write delay signal by delaying the write enable signal by the first delay amount; and a second delay circuit suitable for generating the second write delay signal by delaying the write enable signal by the second delay amount depending on the test mode signal.

7. The semiconductor device according to claim 1, further comprising:

a memory circuit suitable for storing the internal data loaded on a first input/output line, in response to the write command, and storing the internal parity signal loaded on a second input/output line, in response to the write command.

8. The semiconductor device according to claim 7, wherein the memory circuit comprises:

a plurality of banks suitable for storing the internal data in response to the write command and an internal address; and a parity storage circuit suitable for storing the internal parity signal in response to the write command.

9. A semiconductor device comprising:

a write read control circuit suitable for outputting a write enable signal, a read enable signal, and a test mode signal in response to a write command and a read command; and an error correction circuit suitable for performing a first calculation operation of determining error information of input data in response to the write enable signal, outputting an internal parity signal including the error information, outputting internal data by delaying the input data in response to the write enable signal, and performing a second calculation operation of extracting an error correction information for correcting an error of the internal data from the internal parity signal in response to the read enable signal and then outputting output data by delaying the internal data, wherein the test mode signal is a signal which includes time information of the calculation operation.

10. The semiconductor device according to claim 9, wherein the internal data is outputted by being delayed by a time for the first calculation operation indicated by the test mode signal.

11. The semiconductor device according to claim 9, wherein the output data is outputted by being delayed by a time for the second calculation operation indicated by the test mode signal.

12. The semiconductor device according to claim 9, wherein the output data is outputted by correcting the error of the internal data using the error correction information.

13. The semiconductor device according to claim 9, wherein the write read control circuit comprises:

a write enable signal generation circuit suitable for generating the write enable signal including a pulse generated in response to the write command;

a read enable signal generation circuit suitable for generating the read enable signal including a pulse generated in response to the read command; and a mode register set suitable for outputting the test mode signal including time informations of the first and second calculation operations in response to the write command or the read command.

14. The semiconductor device according to claim 9, wherein the error correction circuit comprises:

a write error correction circuit suitable for outputting the internal parity signal and the internal data after performing the first calculation operation in response to the write enable signal and the test mode signal; and a read error correction circuit suitable for outputting the output data by correcting the error of the internal data after performing the second calculation operation in response to the read enable signal and the test mode signal.

15. The semiconductor device according to claim 14, wherein the write error correction circuit comprises:

a write delay circuit suitable for generating a first write delay signal by delaying the write enable signal by a first delay amount, and generating a second write delay signal by delaying the write enable signal by a second delay amount;

a first write repeater suitable for driving first write data in response to the input data at a point of time when the first write delay signal is enabled;

a parity generation circuit suitable for outputting a parity signal after performing the first calculation operation of determining an error information on the first write data;

a second write repeater suitable for driving second write data in response to the input data at a point of time when the second write delay signal is enabled; and a write driver suitable for outputting the parity signal as the internal parity signal in response to a write strobe signal, and outputting the second write data as the internal data in response to the write strobe signal.

16. The semiconductor device according to claim 15, wherein the write delay circuit comprises:

a first delay circuit suitable for generating the first write delay signal by delaying the write enable signal by the first delay amount; and a second delay circuit suitable for generating the second write delay signal by delaying the write enable signal by the second delay amount depending on the test mode signal.

17. The semiconductor device according to claim 16, wherein the second delay amount is larger than the first delay amount and is set as a same delay time as the first calculation operation.

18. The semiconductor device according to claim 14, wherein the read error correction circuit comprises:

a read delay circuit suitable for generating a first read delay signal by delaying the read enable signal by a third delay amount, and generating a second read delay signal by delaying the read enable signal by a fourth delay amount;

a first read repeater suitable for driving first read data in response to the internal data at a point of time when the first read delay signal is enabled;

a syndrome generation circuit suitable for generating a syndrome by performing the second calculation operation of extracting an error correction information on the first read data from the internal parity signal;

a data correction circuit suitable for outputting corrected data by correcting the error of the internal data in response to the syndrome;

a second read repeater suitable for driving second read data in response to the corrected data at a point of time when the second read delay signal is enabled; and a read driver suitable for outputting the second read data as the output data in response to a read strobe signal.

19. The semiconductor device according to claim 18, wherein the read delay circuit comprises:

a third delay circuit suitable for generating the first read delay signal by delaying the read enable signal by the third delay amount; and a fourth delay circuit suitable for generating the second read delay signal by delaying the read enable signal by the fourth delay amount depending on the test mode signal.

20. The semiconductor device according to claim 19, wherein the fourth delay amount is larger than the third delay amount and is set as a same delay time as the second calculation operation.

* * * * *